United States Patent
Sato et al.

(10) Patent No.: US 9,228,251 B2
(45) Date of Patent: *Jan. 5, 2016

(54) FERROMAGNETIC MATERIAL SPUTTERING TARGET

(75) Inventors: Atsushi Sato, Ibaraki (JP); Atsutoshi Arakawa, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 366 days.

This patent is subject to a terminal disclaimer.

(21) Appl. No.: 13/383,886

(22) PCT Filed: Sep. 30, 2010

(86) PCT No.: PCT/JP2010/067160
§ 371 (c)(1),
(2), (4) Date: Jan. 13, 2012

(87) PCT Pub. No.: WO2011/089760
PCT Pub. Date: Jul. 28, 2011

(65) Prior Publication Data
US 2012/0118734 A1    May 17, 2012

(30) Foreign Application Priority Data
Jan. 21, 2010  (JP) ................. 2010-011326

(51) Int. Cl.
*C23C 14/34*   (2006.01)
*B22F 3/10*    (2006.01)
*C22C 19/07*   (2006.01)
*C22C 1/04*    (2006.01)
*H01F 41/18*   (2006.01)

(52) U.S. Cl.
CPC ............... *C22C 19/07* (2013.01); *C22C 1/0433* (2013.01); *C23C 14/3414* (2013.01); *H01F 41/183* (2013.01)

(58) Field of Classification Search
CPC ...... B22F 2998/10; B22F 3/15; B22F 1/0003; C22C 19/07; C22C 27/06
USPC ......................................... 420/436
See application file for complete search history.

(56) References Cited

U.S. PATENT DOCUMENTS

| 6,406,600 B1 | 6/2002 | Takashima |
| 6,716,542 B2 | 4/2004 | Uwazumi et al. |
| 7,909,949 B2 | 3/2011 | Nakamura et al. |
| 7,927,434 B2 | 4/2011 | Nakamura et al. |
| 2005/0223848 A1 | 10/2005 | Ueno et al. |

(Continued)

FOREIGN PATENT DOCUMENTS

| JP | 10-088333 A | 4/1998 |
| JP | 2000-038660 A | 2/2000 |

(Continued)

*Primary Examiner* — Jie Yang
*Assistant Examiner* — Xiaowei Su
(74) *Attorney, Agent, or Firm* — Howson & Howson LLP

(57) ABSTRACT

A ferromagnetic material sputtering target made of metal having a composition containing 20 mol % or less of Cr, and Co as the remainder thereof, wherein the structure of the target includes a metallic substrate (A), and, in the metallic substrate (A), a spherical phase (B) containing 90 wt % or more of Co in which the difference between the longest diameter and the shortest diameter is 0 to 50%. Provided is a ferromagnetic material sputtering target capable of improving the leakage magnetic flux to obtain a stable electrical discharge with a magnetron sputtering device.

42 Claims, 4 Drawing Sheets

(56) References Cited

U.S. PATENT DOCUMENTS

| | | |
|---|---|---|
| 2007/0189916 A1 | 8/2007 | Zhang |
| 2007/0209547 A1 | 9/2007 | Irumata et al. |
| 2008/0062575 A1 | 3/2008 | Shimizu |
| 2009/0229976 A1* | 9/2009 | Kato et al. ............... 204/298.13 |
| 2009/0242393 A1 | 10/2009 | Satoh |
| 2009/0308740 A1 | 12/2009 | Kato et al. |
| 2010/0089622 A1 | 4/2010 | Irumata et al. |
| 2010/0243435 A1 | 9/2010 | Kato |
| 2010/0270146 A1 | 10/2010 | Nonaka et al. |
| 2010/0320084 A1 | 12/2010 | Sato |
| 2011/0003177 A1 | 1/2011 | Wu et al. |
| 2011/0114879 A1 | 5/2011 | Arakawa et al. |
| 2011/0132757 A1 | 6/2011 | Nakamura et al. |
| 2011/0162971 A1 | 7/2011 | Nakamura et al. |
| 2011/0247930 A1 | 10/2011 | Sato |
| 2011/0284373 A1 | 11/2011 | Sato et al. |
| 2012/0097535 A1 | 4/2012 | Ogino et al. |
| 2012/0241317 A1 | 9/2012 | Ikeda et al. |
| 2013/0001079 A1 | 1/2013 | Sato |
| 2013/0015061 A1 | 1/2013 | Sato |
| 2013/0112555 A1* | 5/2013 | Ogino et al. ............. 204/298.13 |
| 2013/0134038 A1 | 5/2013 | Sato et al. |
| 2013/0175167 A1 | 7/2013 | Ikeda et al. |
| 2013/0206592 A1 | 8/2013 | Arakawa et al. |
| 2013/0206593 A1 | 8/2013 | Arakawa et al. |
| 2013/0213802 A1 | 8/2013 | Sato et al. |
| 2013/0213804 A1 | 8/2013 | Arakawa et al. |
| 2013/0220804 A1 | 8/2013 | Arakawa et al. |
| 2013/0341184 A1 | 12/2013 | Morishita et al. |
| 2014/0001038 A1* | 1/2014 | Ogino et al. ............. 204/298.13 |

FOREIGN PATENT DOCUMENTS

| | | |
|---|---|---|
| JP | 2006-176808 A | 7/2006 |
| JP | 2009-001860 A | 1/2009 |
| JP | 2009-028687 A | 2/2009 |
| JP | 2009-132975 A | 6/2009 |
| JP | 2010-255088 A | 11/2010 |

* cited by examiner

Co —— 20μm    Cr —— 20μm    Ti —— 20μm

Si —— 20μm    O —— 20μm

Co ———— 20 μm    Cr ———— 20 μm    Pt ———— 20 μm

Ti ———— 20 μm    O ———— 20 μm

30 μm

FERROMAGNETIC MATERIAL SPUTTERING TARGET

BACKGROUND

The present invention relates to a ferromagnetic material sputtering target for use in the deposition of a magnetic thin film of a magnetic recording medium, and particularly of a magnetic recording layer of a hard disk adopting the perpendicular magnetic recording system, and to a sputtering target which is able to obtain stable electrical discharge when sputtered with a magnetron sputtering device.

In the field of magnetic recording as represented with hard disk drives, a material based on Co, Fe or Ni as ferromagnetic metals is used as the material of the magnetic thin film which is used for the recording. For example, Co—Cr-based or Co—Cr—Pt-based ferromagnetic alloys with Co as its main component are used for the recording layer of hard disks adopting the longitudinal magnetic recording system.

Moreover, composite materials of Co—Cr—Pt-based ferromagnetic alloys with Co as its main component and nonmagnetic inorganic matter are often used for the recording layer of hard disks adopting the perpendicular magnetic recording system which was recently put into practical application.

A magnetic thin film of a magnetic recording medium such as a hard disk is often produced by sputtering a ferromagnetic material sputtering target having the foregoing materials as its components in light of its high productivity.

As a method of manufacturing this kind of ferromagnetic material sputtering target, the melting method or powder metallurgy may be considered. It is not necessarily appropriate to suggest which method is better since it will depend on the demanded characteristics, but a sputtering target made of ferromagnetic alloys and nonmagnetic inorganic particles used for the recording layer of hard disks adopting the perpendicular magnetic recording system is generally manufactured with powder metallurgy. This is because the inorganic particles need to be uniformly dispersed within the alloy substrate, and this is difficult to achieve with the melting method.

For example, proposed is a method of performing mechanical alloying to alloy powder with an alloy phase produced with the rapid solidification method and powder configuring a ceramic phase, uniformly dispersing the powder configuring the ceramic phase in the alloy powder, and molding this by way of hot press to obtain a sputtering target for a magnetic recording medium (Patent Document 1).

The target in the foregoing case has an appearance where the substrate is bonded in the form of soft roe (cod fish sperm) and surrounded by $SiO_2$ (ceramics) (FIG. 2 of Patent Document 1) or dispersed in the shape of thin strings (FIG. 3 of Patent Document 1). Although the other drawings are unclear, it is assumed that they show similar structures.

These structures entail the problems described later, and are not considered to be favorable sputtering targets for a magnetic recording medium. Note that the spherical substance shown in FIG. 4 of Patent Document 1 is mechanical alloying powder, and not a target structure.

Moreover, even if alloy powder produced with the rapid solidification method is not used, a ferromagnetic material sputtering target can be prepared by preparing commercially available raw material powders for the respective components configuring the target, weighing these raw material powders to the intended composition, mixing the powders with well-known methods by using a ball mill or the like, and molding and sintering the mixed powder by way of hot press.

There are various types of sputtering devices, but a magnetron sputtering device comprising a DC power source is broadly used in light of its high productivity for the deposition of the foregoing magnetic recording film. This sputtering method makes a positive electrode substrate and a negative electrode target face each other, and generates an electric field by applying high voltage between the substrate and the target under an inert gas atmosphere.

Here, the sputtering method employs a fundamental principle where inert gas is ionized, plasma composed of electrons and positive ions is formed, and the positive ions in this plasma collide with the target (negative electrode) surface so as to discharge the atoms configuring the target. The extruded atoms adhere to the opposing substrate surface, wherein the film is formed. As a result of performing the sequential process described above, the material configuring the target is deposited on the substrate.

[Patent Document 1] Japanese Published Unexamined Patent Application No.H10-88333

SUMMARY OF THE INVENTION

Generally, if a magnetron sputtering device is used to sputter a ferromagnetic material sputtering target, since much of the magnetic flux from the magnet will pass through the target, which is a ferromagnetic body, the leakage magnetic flux will decrease, and there is a major problem in that a discharge does not occur during the sputtering or, even if a discharge does occur, the discharge is unstable.

In order to overcome this problem, the method of decreasing the content ratio of Co as a ferromagnetic metal can be considered. Nevertheless, this method is not a substantial solution since the intended magnetic recording film cannot be obtained. Moreover, although the leakage magnetic flux can be improved by thinning the thickness of the target, the target life is shortened in this case and costs will increase since the target needs to be replaced frequently.

In light of the problems, an object of this invention is to provide a ferromagnetic material sputtering target capable of improving the leakage magnetic flux to obtain a stable electrical discharge when sputtered with a magnetron sputtering device.

In order to achieve the foregoing object, as a result of intense study, the present inventors discovered that a target with a large leakage magnetic flux can be obtained by adjusting the target structure.

Based on the foregoing discovery, the present invention provides:

1) A ferromagnetic material sputtering target made of metal having a composition containing 20 mol % or less of Cr, and Co as the remainder thereof, wherein the structure of the target includes a metallic substrate (A), and, in the metallic substrate (A), a spherical phase (B) containing 90 wt % or more of Co in which the difference between the longest diameter and the shortest diameter is 0 to 50%.

The present invention additionally provides:

2) A ferromagnetic material sputtering target made of metal having a composition containing 20 mol % or less of Cr, 5 mol % or more and 30 mol % or less of Pt, and Co as the remainder thereof, wherein the structure of the target includes a metallic substrate (A), and, in the metallic substrate (A), a spherical phase (B) containing 90 wt % or more of Co in which the difference between the longest diameter and the shortest diameter is 0 to 50%, The present invention further provides:

3) The ferromagnetic material sputtering target according to 1) or 2) above containing 0.5 mol % or more and 10 mol % or less of one or more elements selected from B, Ti, V, Mn, Zr, Nb, Ru, Mo, Ta, and W as additive elements.

The present invention further provides:

4) The ferromagnetic material sputtering target according to any one of 1) to 3) above, wherein the diameter of the spherical phase (B) is within the range of 30 to 150 μm.

The present invention further provides:

5) The ferromagnetic material sputtering target according to any one of 1) to 4) above, wherein the metallic substrate (A) contains, in the metallic substrate (A), an inorganic material of one or more components selected from carbon, oxides, nitrides and carbides.

The present invention further provides:

6) The ferromagnetic material sputtering target according to any one of 1) to 5) above, wherein the relative density is 98% or more.

A target that is adjusted as described above becomes a target with a large leakage magnetic flux, and stable electrical discharge can be obtained since the promotion of ionization of inert gas will efficiently advance when the target is used in a magnetron sputtering device. Moreover, since the thickness of the target can be made thick, there is an advantage in that the replacement frequency of the target can be reduced, and a magnetic thin film can be produced with low cost.

DETAILED DESCRIPTION OF THE INVENTION

Figure 1:
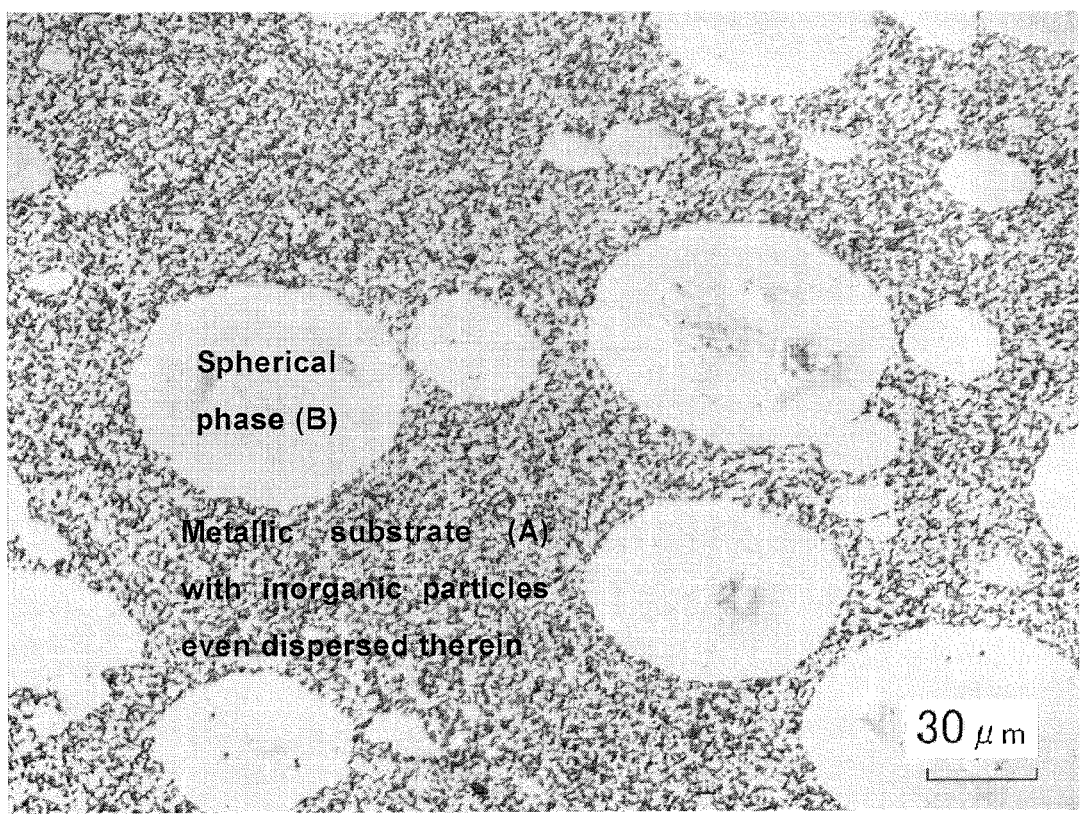
FIG. 1 is a structure image upon observing the polished surface of the target of Example 1 with an optical microscope.

The main component configuring the ferromagnetic material sputtering target of the present invention is metal containing 20 mol % or less of Cr and Co as the remainder thereof, or metal containing 20 mol % or less of Cr, 5 mol % or more and 30 mol % or less of Pt, and Co as the remainder thereof.

Note that Cr is added as an essential component and excludes 0 mol %. Specifically, Cr is contained in an amount that is greater than the analyzable lower limit value. If the Cr content is 20 mol % or less, an effect is yielded even in cases of adding trace amounts. The present invention covers all of the above. These are components which are required as the magnetic recording medium, and, although the blending ratio may be variously changed within the foregoing range, they are able to maintain characteristics as an effective magnetic recording medium.

What is important in the present invention is that the target structure includes a spherical phase (B) containing 90 wt % or more of Co in which the difference between the longest diameter and the shortest diameter is 0 to 50%. In addition, the spherical phase (B) has a higher maximum magnetic permeability than the peripheral structure, and is of a structure that is respectively separated by the metallic substrate (A).

Although the reason why the leakage magnetic flux improves in a target having the foregoing structure is not evident that the moment, it is assumed that a dense part and a sparse part are generated in the magnetic flux inside the target, and, since the magnetostatic energy becomes high in comparison to a structure with uniform magnetic permeability, it is considered that it is more advantageous in terms of energy for the magnetic flux to leak outside the target.

In order to maintain the foregoing maximum magnetic permeability of the spherical phase (B), desirably, the Co concentration is high as possible. Although pure Co is used as the raw material, since the spherical phase (B) mutually diffuses with the peripheral metallic substrate (A) in the sintering process, the Co content of the phase (B) is preferably 90 wt % or more, more preferably 95 wt % or more, and most preferably 97 wt % or more. Co is the main component as described above, but the tendency is for its center to have high purity and its periphery to have slightly lower purity. The spherical phase (B) is assumed to contain therein a body area being centered at the center of the spherical phase (B) and having a size which is ⅓ of the size of the spherical phase (B). According to the present invention, the body area, being referred to as a "near-center area" hereinafter, can have a Co content of 97 wt % or more, and the present invention covers all of the above.

In the present invention, it is also effective to contain 0.5 mol % or more and 10 mol % or less of one or more elements selected from B, Ti, V, Mn, Zr, Nb, Ru, Mo, Ta, and W as additive elements. These are elements which are added as needed in order to improve the characteristics as a magnetic recording medium.

Desirably, the phase (B) has a diameter of 30 to 150 μm and is of a spherical shape. A spherical shape is able to increase the target density since pores are not formed easily at the interface of the metallic substrate (A) and the phase (B) upon manufacturing the target material with the sintering method.

Moreover, since the spherical phase will have a smaller surface area if it is the same volume, the diffusion of metal powders between the metallic substrate (A) and the phase (B) does not advance easily. Consequently, the metallic substrate (A) and the phase (B) of different compositions are easily created, and it is thereby possible to produce a material with a spherical phase (B) containing 90 wt % or more of Co in which the difference between the longest diameter and the shortest diameter is 0 to 50%. The Co content of the phase (B) is more preferably 95 wt % or more, and most preferably 97 wt % or more.

Note that the Co content of the phase (B) can be measured with EPMA. Moreover, any other analytical method capable of measuring the Co content of phase (B) may be similarly applied without restriction.

As shown in FIG. 1, particles of fine inorganic materials (one or more components selected from carbon, oxides, nitrides and carbides) exist in the metallic substrate (A) (the black portions finely dispersed in FIG. 1 are the particles of the inorganic materials). If the diameter of phase (B) is less than 30 μm, the difference in particle size between the particles of the inorganic materials in the metallic substrate (A) and the coexisting metals will become small. Thus, although the diffusion rate of the phase (B) is slow since it is of a spherical shape upon sintering the target material, the diffusion itself will advance, and the existence of the phase (B) will become unclear as the diffusion advances.

Meanwhile, if the diameter of phase (B) exceeds 150 µm, the smoothness of the target surface is lost as the sputtering process advances, and the problem of particles tends to arise. Accordingly, the size of the phase (B) is desirably 30 to 150 µm.

Note that the term "spherical" as used herein refers to a three-dimensional shape including a true sphere, pseudo sphere, oblate spheroid (rotating oval body), and pseudo oblate spheroid. In all cases, the difference between the longest diameter and the shortest diameter is 0 to 50%. Specifically, it could also be said that "spherical" means that the ratio of the maximum value to the minimum value of the length from the center to the outer periphery thereof is 2 or less. According to this range, even if there are some irregularities at the outer peripheral part, it is possible to form a phase (B). If it is difficult to confirm the spherical shape itself, it is also possible to set the ratio of the maximum value to the minimum value of the length from the center of cross section of the phase (B) to the outer periphery thereof to be 2 or less.

Moreover, the spherical phase (B) containing 90 wt % or more of Co in which the difference between the longest diameter and the shortest diameter is 0 to 50% in the metallic substrate (A) is able to achieve the object of the present invention if it is 20% or more of the overall volume of the target or the area of the erosion surface of the target. The present invention is able to manufacture a target in which such spherical phase (B) is 50% or more, and even 60% or more.

Moreover, the ferromagnetic material sputtering target of the present invention can contain an inorganic material of one or more components selected from carbon, oxides, nitrides and carbides in the metallic substrate (A) in a dispersed state. In the foregoing case, the present invention comprises favorable characteristics as a material of a magnetic recording film with a granular structure; particularly a recording film of a hard disk drive adopting the perpendicular magnetic recording system.

The ferromagnetic material sputtering target of the present invention desirably has a relative density of 98% or more. Generally, it is known that, higher the density of the target, the less the generation of particles can be in the sputtering process.

The relative density as used herein is a value that is obtained by dividing the measured density of the target by the calculated density (also referred to as the logical density). The calculated density is the density when hypothesizing that the target constituents are mutually diffused or coexist without reacting, and is calculated with the following formula.

Formula:
Calculated density=Σ(molecular weight of constituents×molar ratio of constituents)/Σ(molecular weight of constituents×molar ratio of constituents/literature value density of constituents)

Here, Σ means taking the sum of all target constituents.

A target that is adjusted as described above becomes a target with a large leakage magnetic flux, and stable electrical discharge can be obtained since the promotion of ionization of inert gas will efficiently advance when the target is used in a magnetron sputtering device. Moreover, since the thickness of the target can be made thick, there is an advantage in that the replacement frequency of the target can be reduced, and a magnetic thin film can be produced with low cost.

In addition, as a result of achieving high densification, there is also an advance in that the generation of particles, which cause the deterioration in the production yield, can be reduced.

The ferromagnetic material sputtering target is manufactured with the melting method or powder metallurgy. In the case of powder metallurgy, foremost, the powders of the respective metal elements and the powders of the additive metal elements are prepared as needed. Desirably, the maximum grain size of these powders is 20 µm or less. Moreover, the alloy powders of these metals may also be prepared in substitute for the powders of the respective metal elements, and, desirably, the maximum grain size is also 20 µm or less in the foregoing case.

Meanwhile, if the grain size is too small, there is a problem in that oxidation is promoted and the component composition will not fall within the intended range.

Thus, desirably, the grain size is 0.1 µm or more.

These raw material powders are weighed to the intended composition, mixed and pulverized with well-known methods by using a ball mill or the like. If inorganic powder is to be added, it should be added to the metal powders at this stage. Carbon powder, oxide powder, nitride powder or carbide powder is prepared as the inorganic powder, and, desirably, the maximum grain size of the inorganic powder is 5 µm or less. Meanwhile, if the grain size is too small, the powders become clumped together, and the grain size is desirably 0.1 µm or more.

Moreover, Co spherical powder with a diameter in the range of 30 to 150 µm is prepared, and mixed with the foregoing mixed powder with a mixer. The Co spherical powder that is used here can be obtained by sieving the powder preparing with the gas atomization method. In addition, as the mixer, a planetary-screw mixer or a planetary-screw agitator/mixer is preferably used. Moreover, when giving consideration to the issue of oxidation in the mixing process, the mixing is preferably performed in an inert gas atmosphere or in a vacuum.

The powder obtained as described above is molded and sintered using a vacuum hot press device and cut into the intended shape in order to prepare the ferromagnetic material sputtering target of the present invention. Note that the foregoing Co spherical powder corresponds to the spherical phase (B) that is observed in the target structure.

Moreover, the molding and sintering processes are not limited to hot press, and the plasma discharge sintering method or the hot isostatic pressing sintering method may also be used. The holding temperature during sintering is preferably set to the lowest temperature within the temperature range in which the target will become sufficiently densified. Although this will depend on the target composition, in many cases the temperature is within the range of 900 to 1300° C.

EXAMPLES

The present invention is now explained in detail with reference to the Examples and Comparative Examples. Note that these Examples are merely illustrative and the present invention shall in no way be limited thereby. In other words, various modifications and other embodiments are covered by the present invention, and the present invention is limited only by the scope of its claims.

Example 1, Comparative Example 1

In Example 1, Co powder with an average particle size of 3 µm, Cr powder with an average particle size 5 µm, $TiO_2$ powder with an average particle size 1 µm, $SiO_2$ powder with an average particle size 1 µm, and Co spherical powder with a diameter within the range of 50 to 100 µm were prepared as the raw material powders. The powders were weighed respectively at a weight ratio of Co powder 11.95 wt %, Cr powder 10.54 wt %, TiO2 powder 6.75 wt %, SiO2 powder 5.07 wt %, and Co spherical powder 65.69 wt % to achieve a target composition of 78 Co-12 Cr-5 TiO$_2$-5 SiO$_2$ (mol %).

Subsequently, the Co powder, Cr powder, TiO$_2$ powder and SiO$_2$ powder were placed in a ball mill pot with a capacity of 10 liters together with zirconia balls as the grinding medium, and rotated and mixed for 20 hours. The obtained mixed powder and the Co spherical powder were mixed for 10 minutes in a planetary-screw mixer with a ball capacity of approximately 7 liters.

This mixed powder was filled in a carbon mold, and hot pressed in a vacuum atmosphere under the following conditions; namely, temperature of 1100° C., holding time of 2 hours, and welding pressure of 30 MPa to obtain a sintered compact. This was further cut with a lathe to obtain a disk-shaped target with a diameter of 180 mm and thickness of 7 mm.

Measurement of the leakage magnetic flux was performed according to ASTM F2086-01 (Standard Test Method for Pass through Flux of Circular Magnetic Sputtering Targets, Method 2). The leakage magnetic flux density measured by fixing the target center and rotating it 0 degrees, 30 degrees, 60 degrees, 90 degrees, and 120 degrees was divided by the value of the reference field defined in the ASTM and represented in percentage by multiplying 100 thereto. The result of averaging the foregoing five points is indicated in Table 1 as the average leakage magnetic flux (%).

In Comparative Example 1, Co powder with an average particle size of 3 μm, Cr powder with an average particle size of 5 μm, TiO$_2$ powder with an average grain size of 1 m and SiO2 powder with an average particle size of 1 m were prepared as the raw material powders. These powders were respectively weighed at a weight ratio of Co powder 77.64 wt %, Cr powder 10.54 wt %, TiO$_2$ powder 6.75 wt %, and SiO$_2$ powder 5.07 wt % to achieve a target composition of 78 Co-12 Cr-5 TiO$_2$-5 SiO$_2$ (mol %).

These powders were placed in a ball mill pot with a capacity of 10 liters together with zirconia balls as the grinding medium, and rotated and mixed for 20 hours.

Subsequently, the foregoing mixed powder was filled in a carbon mold, and hot pressed in a vacuum atmosphere under the following conditions; namely, temperature of 1100° C., holding time of 2 hours, and welding pressure of 30 MPa to obtain a sintered compact. This was further cut with a lathe to obtain a disk-shaped target with a diameter of 180 mm and thickness of 7 mm, and the average leakage magnetic flux density was measured. The results are shown in Table 1.

TABLE 1

| | Raw material powder | Average leakage magnetic flux | Relative density |
| --- | --- | --- | --- |
| Example 1 | Co powder, Cr powder, TiO$_2$ powder, SiO$_2$ powder, Co spherical powder (50 to 100 μm) | 56% | 98.6% |
| Comparative Example 1 | Co powder, Cr powder, TiO$_2$ powder, SiO$_2$ powder | 40% | 98.7% |

As shown in Table 1, the average leakage magnetic flux density of the target of Example 1 was 56%, and considerable improvement from the 40% of Comparative Example 1 has been confirmed. Moreover, Example 1 was also able to obtain a high density target exceeding 98%.

Figure 2:
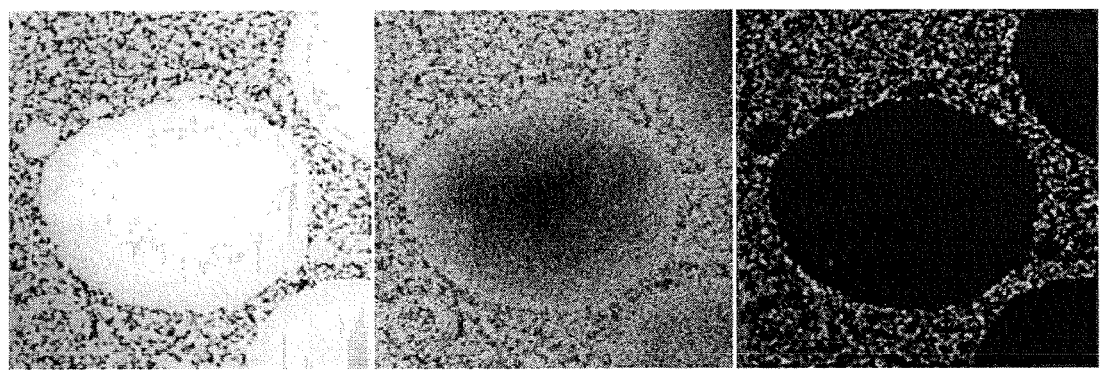
FIG. 2 is a diagram showing an element distribution image upon measuring the polished surface of the target of Example 1 with an electron probe micro analyzer (EPMA).
Figure 2:
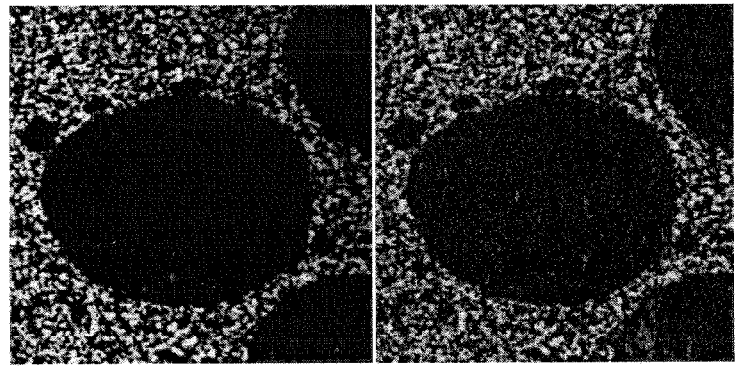

The structure image upon observing the target polished surface of Example 1 with an optical microscope is shown in FIG. 1, and the element distribution image upon particularly measuring the portion of the spherical phase with EPMA is shown in FIG. 2.

The blackish portions in FIG. 1 correspond to the TiO$_2$ particles and SiO$_2$ particles. As shown with the structure image of FIG. 1, what is extremely unique in Example 1 is that a large spherical phase, which does not contain TiO$_2$ particles or SiO$_2$ particles, is dispersed in a matrix in which the TiO$_2$ particles and SiO$_2$ particles are micro-dispersed.

This phase corresponds to the phase (B) of the present invention, and the vicinity of center of the phase (B) contains 99 wt % or more of Co with the average difference between the longest diameter and the shortest diameter being approximately 20%, and took on an approximately spherical shape.

In FIG. 2, the white portion in the element distribution image of EPMA is the area with a high concentration of the relevant element. Specifically, the concentration of Co in the portion of the spherical phase is higher (whiter) than its periphery. Meanwhile, in FIG. 2, Si, Ti and O are black in the area of the spherical phase, and it is evident that they hardly exist in this area.

Figure 3:
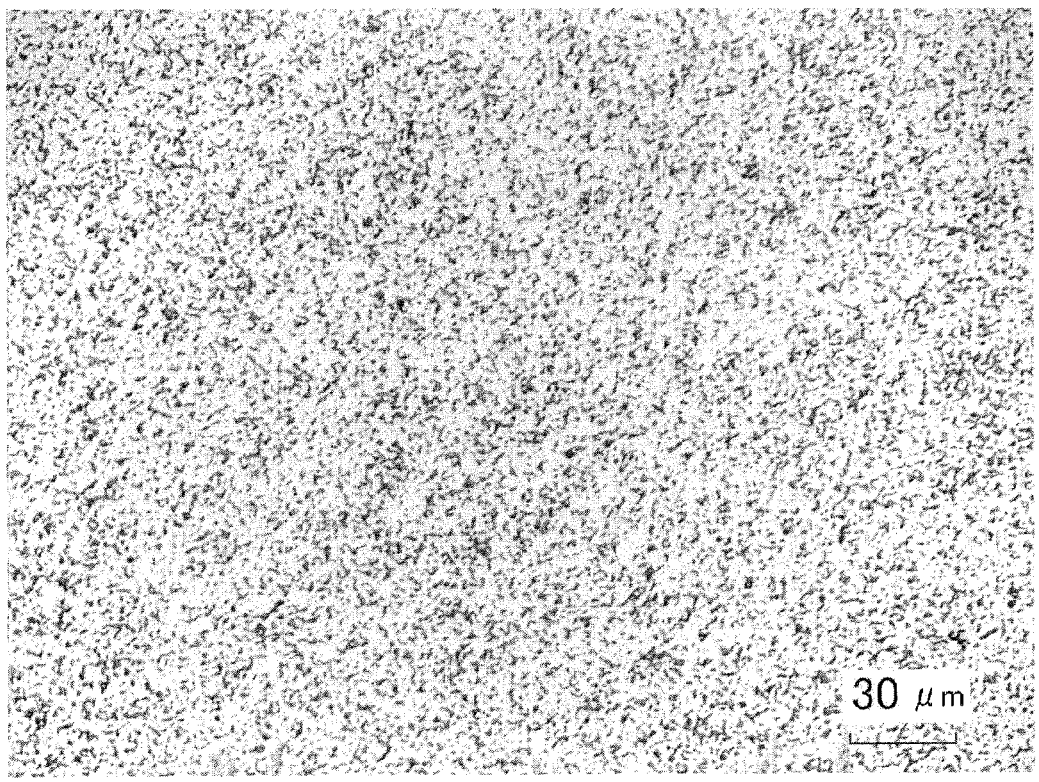
FIG. 3 is a structure image upon observing the polished surface of the target of Comparative Example 1 with an optical microscope.

Whereas, in the structure image of the target polished surface obtained with Comparative Example 1 shown in FIG. 3, it was not possible to observe any spherical phase in the matrix with the TiO$_2$ and SiO$_2$ particles dispersed therein.

Example 2, Comparative Example 2

In Example 2, Co powder with an average particle size of 3 μm, Cr powder with an average grain size of 5 μm, Pt powder with an average grain size of 2 μm, TiO$_2$ powder with an average grain size of 1 μm, Cr$_2$O$_3$ powder with an average particle size of 3 μm, and Co spherical powder with a diameter within the range of 50 to 100 μm were prepared as the raw material powders.

These powders were respectively weighed at a weight ratio of Co powder 26.27 wt %, Cr powder 9.94 wt %, Pt powder 32.31 wt %, TiO$_2$ powder 5.09 wt %, Cr$_2$O$_3$ powder 3.87 wt %, and Co spherical powder 22.52 wt % to achieve a target composition of 65 Co-13 Cr-15 Pt-5 TiO$_2$-2 Cr$_2$O$_3$ (mol %).

Subsequently, the Co powder, Cr powder, Pt powder, TiO$_2$ powder and Cr$_2$O$_3$ powder were placed in a ball mill pot with a capacity of 10 liters together with zirconia balls as the grinding medium, and rotated and mixed for 20 hours. The obtained mixed powder and the Co spherical powder were mixed for 10 minutes in a planetary-screw mixer with a ball capacity of approximately 7 liters.

This mixed powder was filled in a carbon mold, and hot pressed in a vacuum atmosphere under the following conditions; namely, temperature of 1050° C., holding time of 2 hours, and welding pressure of 30 MPa to obtain a sintered compact. This was further processed with a lathe to obtain a disk-shaped target with a diameter of 180 mm and thickness of 7 mm, and the average leakage magnetic flux density was measured. The results are shown in Table 2.

In Comparative Example 2, Co powder with an average particle size of 3 μm, Cr powder with an average particle size of 5 μm, Pt powder with an average grain size of 2 μm, TiO$_2$ powder with an average grain size of 1 μm and Cr$_2$O$_3$ powder with an average particle size of 3 μm were prepared as the raw material powders.

These powders were respectively weighed at a weight ratio of Co powder 48.79 wt %, Cr powder 9.94 wt %, Pt powder 32.31 wt %, TiO$_2$ powder 5.09 wt %, and Cr$_2$O$_3$ powder 3.87 wt % to achieve a target composition of 65 Co-13 Cr-15 Pt-5 TiO$_2$-2 Cr$_2$O$_3$ (mol %).

These powders were placed in a ball mill pot with a capacity of 10 liters together with zirconia balls as the grinding medium, and rotated and mixed for 20 hours.

Subsequently, the foregoing mixed powder was filled in a carbon mold, and hot pressed in a vacuum atmosphere under the following conditions; namely, temperature of 1050° C., holding time of 2 hours, and welding pressure of 30 MPa to obtain a sintered compact. This was further processed with a lathe to obtain a disk-shaped target with a diameter of 180 mm and thickness of 7 mm, and the average leakage magnetic flux density was measured, The results are shown in Table 2.

TABLE 2

|  | Raw material powder | Average leakage magnetic flux | Relative density |
|---|---|---|---|
| Example 2 | Co powder, Cr powder, Pt powder, $TiO_2$ powder, $Cr_2O_3$ powder, Co spherical powder (50 to 100 μm) | 51% | 99.3% |
| Comparative Example 2 | Co powder, Cr powder, Pt powder, $TiO_2$ powder, $Cr_2O_3$ powder | 38% | 99.1% |

As shown in Table 2, the average leakage magnetic flux density of the target of Example 2 was 51%, and considerable improvement from the 38% of Comparative Example 2 has been confirmed. Moreover, Example 2 was also able to obtain a high density target exceeding 98%.

Figure 4:
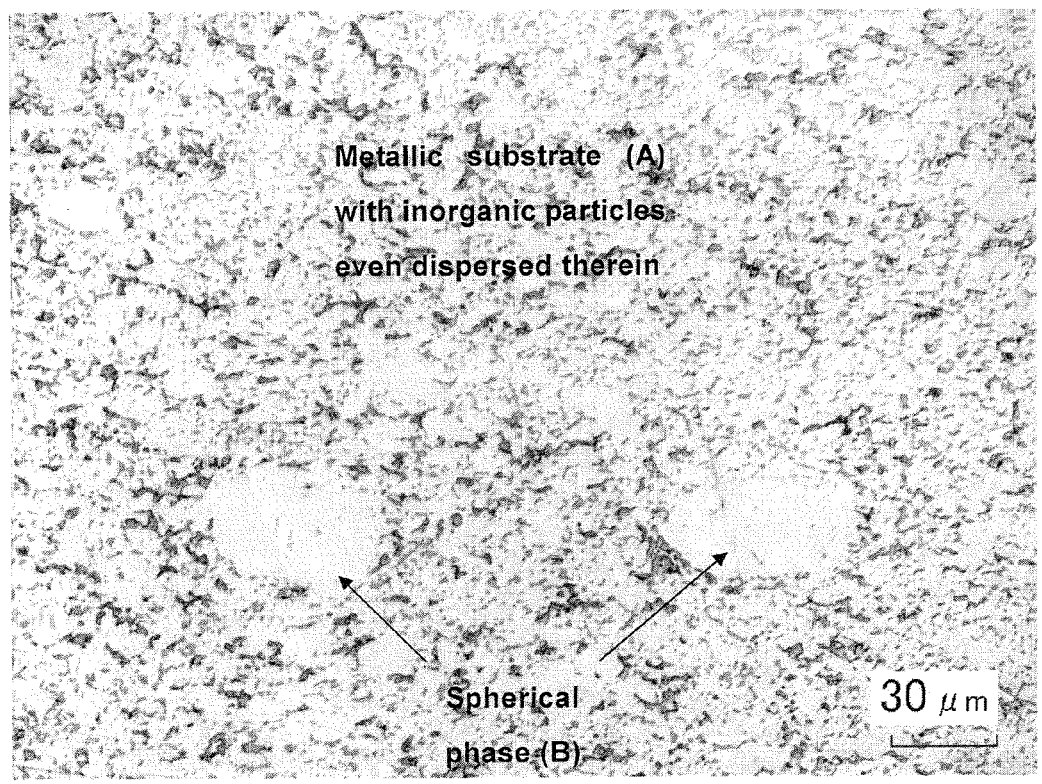
FIG. 4 is a structure image upon observing the polished surface of the target of Example 2 with an optical microscope.
Figure 5:
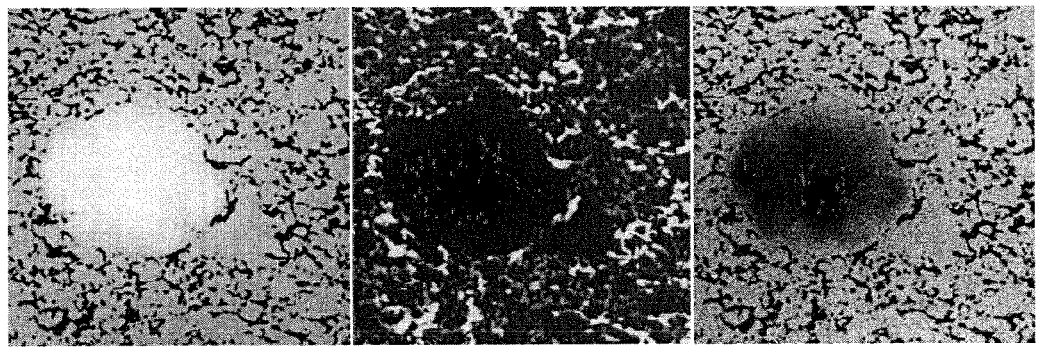
FIG. 5 is a diagram showing an element distribution image upon measuring the polished surface of the target of Example 2 with an electron probe micro analyzer (EPMA).
Figure 5:
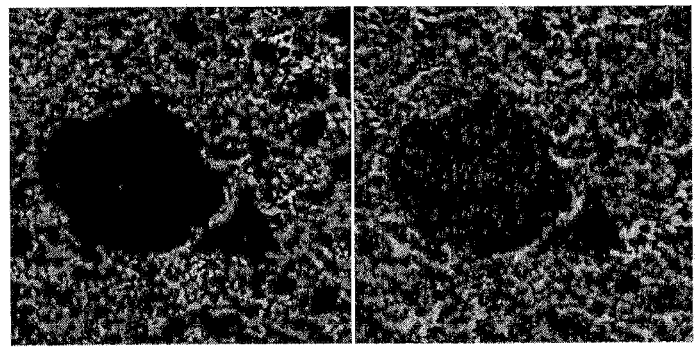

The structure image upon observing the target polished surface of Example 2 with an optical microscope is shown in FIG. 4, and the element distribution image upon particularly measuring the portion of the spherical phase with EPMA is shown in FIG. 5. The blackish portions in FIG. 4 correspond to the $TiO_2$ particles and $Cr_2O_3$ particles.

As shown with the structure image of FIG. 4, what is extremely unique in Example 2 is that a large spherical phase, which does not contain $TiO_2$ particles or $Cr_2O_3$ particles, is dispersed in a matrix in which the $TiO_2$ particles and $Cr_2O_3$ particles are micro-dispersed. This phase corresponds to the phase (B) of the present invention, and the center part of the phase (B) contains 99 wt % or more of Co with the average difference between the longest diameter and the shortest diameter being approximately 20%, and took on an approximately spherical shape.

In FIG. 5, the white portion in the element distribution image of EPMA is the area with a high concentration of the relevant element. Specifically, the concentration of Co in the portion of the spherical phase is higher (whiter) than its periphery.

Meanwhile, in FIG. 5, although Cr and Pt exist at the peripheral edge of the spherical phase, they are hardly observed at the center part. Moreover, in FIGS. 5, Ti and O are black in the area of the spherical phase, and it is evident that they do not exist in this area.

Figure 6:
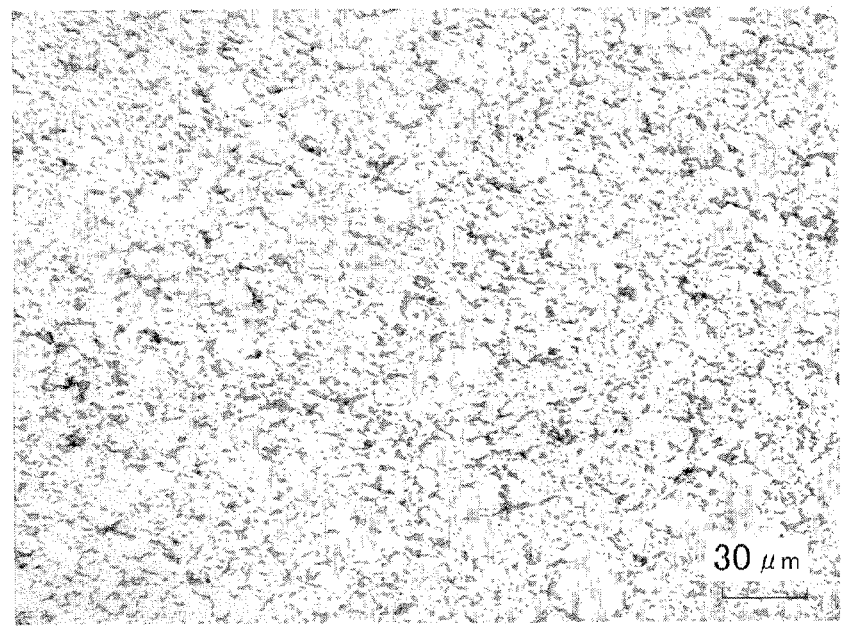
FIG. 6 is a structure image upon observing the polished surface of the target of Comparative Example 2 with an optical microscope.

Whereas, in the structure image of the target polished surface obtained with Comparative Example 2 shown in FIG. 6, it was not possible to observe any spherical phase in the matrix with the $TiO_2$ particles and $Cr_2O_3$ particles dispersed therein.

Example 3, Comparative Example 3

In Example 3, Co powder with an average particle size of 3 μm, Cr powder with an average grain size of 5 μm, and Co spherical powder with a diameter within the range of 50 to 100 μm were prepared as the raw material powders.

These powders were respectively weighed at a weight ratio of Co powder 45.81 wt %, Cr powder 13.47 wt %, and Co spherical powder 40.72 wt % to achieve a target composition of 85 Co-15 Cr (mol %).

Subsequently, the Co powder and Cr powder were placed in a ball mill pot with a capacity of 10 liters together with zirconia balls as the grinding medium, and rotated and mixed for 20 hours. The obtained mixed powder and the Co spherical powder were mixed for 10 minutes in a planetary-screw mixer with a ball capacity of approximately 7 liters.

This mixed powder was filled in a carbon mold, and hot pressed in a vacuum atmosphere under the following conditions; namely, temperature of 950° C., holding time of 2 hours, and welding pressure of 30 MPa to obtain a sintered compact. This was further processed with a lathe to obtain a disk-shaped target with a diameter of 180 mm and thickness of 7 mm, and the average leakage magnetic flux density was measured. The results are shown in Table 3.

In Comparative Example 3, Co powder with an average particle size of 3 μm, and Cr powder with an average particle size of 5 μm were prepared as the raw material powders.

These powders were respectively weighed at a weight ratio of Co powder 86.53 wt % and Cr powder 13.47 wt % to achieve a target composition of 85 Co-15 Cr (mol %).

These powders were placed in a ball mill pot with a capacity of 10 liters together with zirconia balls as the grinding medium, and rotated and mixed for 20 hours.

Subsequently, the foregoing mixed powder was filled in a carbon mold, and hot pressed in a vacuum atmosphere under the following conditions; namely, temperature of 950° C., holding time of 2 hours, and welding pressure of 30 MPa to obtain a sintered compact. This was further processed with a lathe to obtain a disk-shaped target with a diameter of 180 mm and thickness of 7 mm, and the average leakage magnetic flux density was measured, The results are shown in Table 3.

TABLE 3

|  | Raw material powder | Average leakage magnetic flux | Relative density |
|---|---|---|---|
| Example 3 | Co powder, Cr powder, Co spherical powder (50 to 100 μm) | 60% | 99.3% |
| Comparative Example 3 | Co powder, Cr powder | 35% | 98.7% |

As shown in Table 3, the average leakage magnetic flux density of the target of Example 3 was 60%, and considerable improvement from the 35% of Comparative Example 3 has been confirmed. Moreover, Example 3 was also able to obtain a high density target exceeding 98%.

Moreover, upon polishing the target of Example 3 and acquiring an element distribution image of the polished surface with EPMA, a spherical phase in which the concentration of Co is higher than its periphery was confirmed. This phase corresponds to the phase (B) of the present invention, and the center part of the phase (B) contains 98 wt % or more of Co with the average difference between the longest diameter and the shortest diameter being approximately 20%, and took on an approximately spherical shape.

Meanwhile, no spherical phase was observed on the polished surface of the target obtained with Comparative Example 3. Moreover, upon obtaining an element distribution image with EPMA, no contrasting density was observed in the element distribution, and the formation of an alloy phase with an approximately uniform composition was confirmed.

Example 4, Comparative Example 4

In Example 4, Co powder with an average particle size of 3 μm, Cr powder with an average grain size of 5 μm, Pt powder with an average grain size of 2 μm, and Co spherical powder with a diameter within the range of 50 to 100 μm were prepared as the raw material powders.

These powders were respectively weighed at a weight ratio of Co powder 11.29 wt %, Cr powder 9.96 wt %, Pt powder 37.36 wt %, and Co spherical powder 41.39 wt % to achieve a target composition of 70 Co-15 Cr-15 Pt (mol %).

Subsequently, the Co powder, Cr powder and Pt powder were placed in a ball mill pot with a capacity of 10 liters together with zirconia balls as the grinding medium, and rotated and mixed for 20 hours. The obtained mixed powder and the Co spherical powder were mixed for 10 minutes in a planetary-screw mixer with a ball capacity of approximately 7 liters. This mixed powder was filled in a carbon mold, and hot pressed in a vacuum atmosphere under the following conditions; namely, temperature of 1050° C., holding time of 2 hours, and welding pressure of 30 MPa to obtain a sintered compact. This was further processed with a lathe to obtain a disk-shaped target with a diameter of 180 mm and thickness of 7 mm, and the average leakage magnetic flux density was measured. The results are shown in Table 4.

In Comparative Example 4, Co powder with an average particle size of 3 μm, Cr powder with an average particle size of 5 μm and Pt powder with an average grain size of 2 μm were prepared as the raw material powders.

These powders were respectively weighed at a weight ratio of Co powder 52.68 wt %, Cr powder 9.96 wt %, and Pt powder 37.36 wt % to achieve a target composition of 70 Co-15 Cr-15 Pt (mol %).

These powders were placed in a ball mill pot with a capacity of 10 liters together with zirconia balls as the grinding medium, and rotated and mixed for 20 hours.

Subsequently, the foregoing mixed powder was filled in a carbon mold, and hot pressed in a vacuum atmosphere under the following conditions; namely, temperature of 1050° C., holding time of 2 hours, and welding pressure of 30 MPa to obtain a sintered compact. This was further processed with a lathe to obtain a disk-shaped target with a diameter of 180 mm and thickness of 7 mm, and the average leakage magnetic flux density was measured. The results are shown in Table 4.

TABLE 4

|  | Raw material powder | Average leakage magnetic flux | Relative density |
| --- | --- | --- | --- |
| Example 4 | Co powder, Cr powder, Pt powder, Co spherical powder (50 to 100 μm) | 56% | 99.5% |
| Comparative Example 4 | Co powder, Cr powder, Pt powder | 39% | 99.2% |

As shown in Table 4, the average leakage magnetic flux density of the target of Example 4 was 56%, and considerable improvement from the 39% of Comparative Example 4 has been confirmed. Moreover, Example 4 was also able to obtain a high density target exceeding 98%.

Moreover, upon polishing the target of Example 4 and acquiring an element distribution image of the polished surface with EPMA, a spherical phase in which the concentration of Co is higher than its periphery was confirmed. This phase corresponds to the phase (B) of the present invention, and the center part of the phase (B) contains 98 wt % or more of Co with the average difference between the longest diameter and the shortest diameter being approximately 20%, and took on an approximately spherical shape.

Meanwhile, no spherical phase was observed on the polished surface of the target obtained with Comparative Example 4. Moreover, upon obtaining an element distribution image with EPMA, no contrasting density was observed in the element distribution, and the formation of an alloy phase with an approximately uniform composition was confirmed.

In Examples 1 to 4, the existence of the metallic substrate (A) and the spherical phase (B) with a diameter within the range of 50 to 100 μm surrounded by the metallic substrate (A) was confirmed in all cases. Moreover, it was also confirmed that the phase (B) is an area with higher Co concentration than its periphery. Thus, it is evident that this kind of structure plays an extremely important role in improving the leakage magnetic flux.

The present invention is able to dramatically improve the leakage magnetic flux by adjusting the structure of the ferromagnetic material sputtering target. By using the target of the present invention, a stable discharge can be obtained during sputtering performed with a magnetron sputtering device. in addition, since the target thickness can be increased, the target life can be prolonged and a magnetic thin film can be manufactured with low cost. The present invention is useful as a ferromagnetic material sputtering target for use in the deposition of a magnetic thin film of a magnetic recording medium, and particularly of a magnetic recording layer of a hard disk.

The invention claimed is:

1. A ferromagnetic material sputtering target having a composition comprising metal elements including 20 mol % or less of Cr and Co as the remainder, wherein the sputtering target has a structure comprising a metallic matrix (A) and a metallic phase (B) dispersed in the metallic matrix (A), the metallic phase (B) having a Co content of 90 wt % or more and being in a form of a plurality of separate spherical, pseudo-spherical, oblate spheroidal, or pseudo-oblate spheroidal shaped particles such that a difference in length of a shortest diameter of each of the metallic phase (B) particles and a longest diameter of each the metallic phase (B) particles is 0 to 50% of the longest diameter, wherein a maximum magnetic permeability of the metallic phase (B) is higher than that of the metal matrix (A) surrounding the metallic phase (B), wherein the metallic phase (B) contained in the sputtering target has as a whole a volume of 20 vol % or more of a total volume of the sputtering target, and wherein each of the particles of the metallic phase (B) has a size of 30 to 150 μm.

2. The ferromagnetic material sputtering target according to claim 1, wherein the sputtering target further contains 0.5 mol % or more and 10 mol % or less in total of one or more elements as additive elements selected from B, Ti, V, Mn, Zr, Nb, Ru, Mo, Ta and W.

3. The ferromagnetic material sputtering target according to claim 2, wherein the metallic matrix (A) further contains a dispersion of inorganic particles of one or more inorganic substances selected from the group consisting of carbon, oxides, nitrides and carbides.

4. The ferromagnetic material sputtering target according to claim 3, wherein the sputtering target has a relative density of 98% or more.

5. The ferromagnetic material sputtering target according to claim 1, wherein the metallic matrix (A) further contains a dispersion of inorganic particles of one or more inorganic substances selected from the group consisting of carbon, oxides, nitrides and carbides.

6. The ferromagnetic material sputtering target according to claim 1, wherein the sputtering target has a relative density of 98% or more.

7. The ferromagnetic material sputtering target according to claim 1, wherein the sputtering target has an average leakage magnetic flux of 51% to 60%.

8. The ferromagnetic material sputtering target according to claim 7, wherein the sputtering target has a thickness of about 7 mm.

9. The ferromagnetic material sputtering target according to claim 1, wherein the metallic phase (B) has a Co content of 95 wt % or more.

10. The ferromagnetic material sputtering target according to claim 1, wherein the metallic phase (B) contained in the sputtering target has as a whole a volume of 50 vol % or more of the total volume of the sputtering target.

11. The ferromagnetic material sputtering target according to claim 1, wherein the metallic phase (B) contained in the sputtering target has as a whole a volume of 60 vol % or more of the total volume of the sputtering target.

12. A ferromagnetic material sputtering target consisting of a composition of 20 mol % or less of Cr and Co as the remainder, wherein the sputtering target has a structure comprising a metallic matrix (A) and a metallic phase (B) dispersed in the metallic matrix (A), the metallic phase (B) having a Co content of 90 wt % or more and being in a form of a plurality of separate spherical, pseudo-spherical, oblate spheroidal, or pseudo-oblate spheroidal shaped particles such that a difference in length of a shortest diameter of each of the metallic phase (B) particles and a longest diameter of each the metallic phase (B) particles is 0 to 50% of the longest diameter, wherein a maximum magnetic permeability of the metallic phase (B) is higher than that of the metal matrix (A) surrounding the metallic phase (B), and wherein the metallic phase B) contained in the sputtering target has as a whole a volume of 20 vol % or more of a total volume of the sputtering target.

13. The ferromagnetic material sputtering target according to claim 12, wherein the size of each of the metallic phase (B) particles is 30 to 150 μm.

14. The ferromagnetic material sputtering target according to claim 12, wherein the target body has a relative density of 98% or more.

15. The ferromagnetic material sputtering target according to claim 12, wherein the sputtering target has an average leakage magnetic flux of 51% to 60%.

16. The ferromagnetic material sputtering target according to claim 15, wherein the sputtering target has a thickness of about 7 mm.

17. The ferromagnetic material sputtering target according to claim 12, wherein the metallic phase (B) has a Co content of 95 wt % or more.

18. The ferromagnetic material sputtering target according to claim 12, wherein the metallic phase (B) contained in the sputtering target has as a whole a volume of 50 vol % or more of the total volume of the sputtering target.

19. The ferromagnetic material sputtering target according to claim 12, wherein the metallic phase (B) contained in the sputtering target has as a whole a volume of 60 vol % or more of the total volume of the sputtering target.

20. A ferromagnetic material sputtering target having a composition comprising metal elements including 20 mol % or less of Cr and Co as the remainder, wherein the sputtering target has a structure comprising a metallic matrix (A) and a metallic phase (B) dispersed in the metallic matrix (A), the metallic phase (B) having a Co content of 97 wt % or more and being in a form of a plurality of separate spherical, pseudo-spherical, oblate spheroidal, or pseudo-oblate spheroidal shaped particles such that a difference in length of a shortest diameter of each of the metallic phase (B) particles and a longest diameter of each the metallic phase (B) particles is 0 to 50% of the longest diameter, wherein a maximum magnetic permeability of the metallic phase (B) is higher than that of the metal matrix (A) surrounding the metallic phase (B), wherein the metallic phase (B) contained in the sputtering target has as a whole a volume of 20 vol % or more of a total volume of the sputtering target.

21. The ferromagnetic material sputtering target according to claim 20, wherein each of the particles of the metallic phase (B) has a size of 30 to 150 μm.

22. The ferromagnetic material sputtering target according to claim 20, wherein the sputtering target has a relative density of 98% or more.

23. The ferromagnetic material sputtering target according to claim 20, wherein the sputtering target further contains 0.5 mol % or more and 10 mol % or less in total of one or more elements as additive elements selected from B, Ti, V, Mn, Zr, Nb, Ru, Mo, Ta and W.

24. The ferromagnetic material sputtering target according to claim 23, wherein the metallic matrix (A) further contains a dispersion of inorganic particles of one or more inorganic substances selected from the group consisting of carbon, oxides, nitrides and carbides.

25. The ferromagnetic material sputtering target according to claim 24, wherein the sputtering target has a relative density of 98% or more.

26. The ferromagnetic material sputtering target according to claim 20, wherein the metallic matrix (A) further contains a dispersion of inorganic particles of one or more inorganic substances selected from the group consisting of carbon, oxides, nitrides and carbides.

27. The ferromagnetic material sputtering target according to claim 20, wherein the sputtering target has an average leakage magnetic flux of 51% to 60%.

28. The ferromagnetic material sputtering target according to claim 27, wherein the sputtering target has a thickness of about 7 mm.

29. The ferromagnetic material sputtering target according to claim 20, wherein the metallic phase (B) contained in the sputtering target has as a whole a volume of 50 vol % or more of the total volume of the sputtering target.

30. The ferromagnetic material sputtering target according to claim 20, wherein the metallic phase (B) contained in the sputtering target has as a whole a volume of 60 vol % or more of the total volume of the sputtering target.

31. A ferromagnetic material sputtering target having a composition comprising metal elements including 20 mol % or less of Cr and Co as the remainder, wherein the sputtering target has a structure comprising a metallic matrix (A) and a metallic phase (B) dispersed in the metallic matrix (A), a center portion of each of the particles of the metallic phase (B) having a Co content of 97 wt % or more and being in a form of a plurality of separate spherical, pseudo-spherical, oblate spheroidal, or pseudo-oblate spheroidal shaped particles such that a difference in length of a shortest diameter of each of the metallic phase (B) particles and a longest diameter of each the metallic phase (B) particles is 0 to 50% of the longest diameter, wherein a maximum magnetic permeability of the metallic phase (B) is higher than that of the metal matrix (A) surrounding the metallic phase (B), wherein the metallic phase (B) contained in the sputtering target has as a whole a volume of 20 vol % or more of a total volume of the sputtering target.

32. The ferromagnetic material sputtering target according to claim 31, wherein each of the particles of the metallic phase (B) has a size of 30 to 150 μm.

33. The ferromagnetic material sputtering target according to claim 31, wherein the sputtering target has a relative density of 98% or more.

34. The ferromagnetic material sputtering target according to claim 31, wherein the sputtering target further contains 0.5 mol % or more and 10 mol % or less in total of one or more elements as additive elements selected from B, Ti, V, Mn, Zr, Nb, Ru, Mo, Ta and W.

35. The ferromagnetic material sputtering target according to claim 34, wherein the metallic matrix (A) further contains a dispersion of inorganic particles of one or more inorganic substances selected from the group consisting of carbon, oxides, nitrides and carbides.

36. The ferromagnetic material sputtering target according to claim 35, wherein the sputtering target has a relative density of 98% or more.

37. The ferromagnetic material sputtering target according to claim 31, wherein the metallic matrix (A) further contains a dispersion of inorganic particles of one or more inorganic substances selected from the group consisting of carbon, oxides, nitrides and carbides.

38. The ferromagnetic material sputtering target according to claim 31, wherein the sputtering target has an average leakage magnetic flux of 51% to 60%.

39. The ferromagnetic material sputtering target according to claim 38, wherein the sputtering target has a thickness of about 7 mm.

40. The ferromagnetic material sputtering target according to claim 31, wherein the metallic phase (B) has a Co content of 95 wt % or more.

41. The ferromagnetic material sputtering target according to claim 31, wherein the metallic phase (B) contained in the sputtering target has as a whole a volume of 50 vol % or more of the total volume of the sputtering target.

42. The ferromagnetic material sputtering target according to claim 31, wherein the metallic phase (B) contained in the sputtering target has as a whole a volume of 60 vol % or more of the total volume of the sputtering target.

* * * * *